United States Patent
Sekiguchi

(10) Patent No.: US 11,671,045 B2
(45) Date of Patent: Jun. 6, 2023

(54) TRANSPORT APPARATUS AND CONTROL METHOD

(71) Applicant: CANON KABUSHIKI KAISHA, Tokyo (JP)

(72) Inventor: Hiromu Sekiguchi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/384,492

(22) Filed: Jul. 23, 2021

(65) Prior Publication Data

US 2022/0038039 A1    Feb. 3, 2022

(30) Foreign Application Priority Data

Jul. 30, 2020  (JP) .............................. JP2020-129551

(51) Int. Cl.
| | |
|---|---|
| *H02P 7/00* | (2016.01) |
| *H02P 21/22* | (2016.01) |
| *G01R 31/389* | (2019.01) |
| *B65G 43/08* | (2006.01) |

(52) U.S. Cl.
CPC .............. *H02P 21/22* (2016.02); *B65G 43/08* (2013.01); *G01R 31/389* (2019.01)

(58) Field of Classification Search
CPC ........................................ H02P 21/22
USPC ....................................... 318/432
See application file for complete search history.

(56) References Cited

U.S. PATENT DOCUMENTS

| | | | |
|---|---|---|---|
| 2012/0091928 A1* | 4/2012 | Markon | H02P 6/18 318/135 |
| 2016/0226417 A1* | 8/2016 | Nomura | H02P 25/064 |
| 2016/0344304 A1* | 11/2016 | Ichihara | H02M 1/08 |
| 2017/0256145 A1* | 9/2017 | Macours | H02P 25/034 |
| 2018/0059793 A1* | 3/2018 | Hajati | H02K 33/02 |

FOREIGN PATENT DOCUMENTS

JP     2011137688 A     7/2011

* cited by examiner

*Primary Examiner* — Erick D Glass
(74) *Attorney, Agent, or Firm* — Canon U.S.A., Inc. I.P. Division

(57) ABSTRACT

A transport apparatus includes an electric motor having a mover and coils, and a control device that controls the electric motor and includes a measuring unit and a control unit. The coils drives the mover by applying a current to each of the coils. The measuring unit measures an impedance of each coil. The control unit controls the current flowing through each of the coils based on a third current command value in which a first current command value, indicating a current corresponding to a thrust command value indicating a thrust applied to the mover, and a second current command value, indicating a current for measuring the impedance, are superimposed. The control unit determines the second current command value such that the mover does not receive a thrust due to a component corresponding to the second current command value in the current flowing through each coil when measuring the impedance.

23 Claims, 11 Drawing Sheets

TRANSPORT APPARATUS AND CONTROL METHOD

BACKGROUND

Field

The present disclosure relates to a transport apparatus and a control method.

Description of the Related Art

Japanese Patent Application Laid-Open No. 2011-137688 discloses a method of measuring an impedance of a three-phase electric apparatus in a hot line state without affecting its operating state. An impedance measuring apparatus disclosed in Japanese Patent Application Laid-Open No. 2011-137688 has a circuit configuration in which a neutral point of a three-phase electric apparatus and a neutral point of a three-phase inductive element are connected by a zero-phase power source, and measures the impedance based on a current flowing through the zero-phase power source and a voltage applied to the three-phase electric apparatus.

In order to perform the impedance measurement disclosed in Japanese Patent Application Laid-Open No. 2011-137688, a special circuit configuration is required, in which the neutral point of the three-phase electric apparatus and the neutral point of the three-phase inductive element are connected by the zero-phase power source.

SUMMARY

The present disclosure relates to providing a transport apparatus and a control method capable of measuring impedance of an electric motor with a small restriction on circuit configuration.

According to an aspect of the present disclosure, a transport apparatus includes an electric motor including a mover and a plurality of coils configured to drive the mover by applying a current to each of the plurality of coils, and a control device configured to control the electric motor, wherein the control device includes a measuring unit configured to measure an impedance of each of the plurality of coils, and includes a control unit configured to control the current flowing through each of the plurality of coils based on a third current command value in which a first current command value indicating a current corresponding to a thrust command value indicating a thrust applied to the mover and a second current command value indicating a current for measuring the impedance are superimposed, wherein the control unit is configured to determine the second current command value such that the mover does not receive a thrust due to a component corresponding to the second current command value in the current flowing through each of the plurality of coils when measuring the impedance.

Further features of the present disclosure will become apparent from the following description of exemplary embodiments with reference to the attached drawings.

DESCRIPTION OF THE EMBODIMENTS

Figure 1:
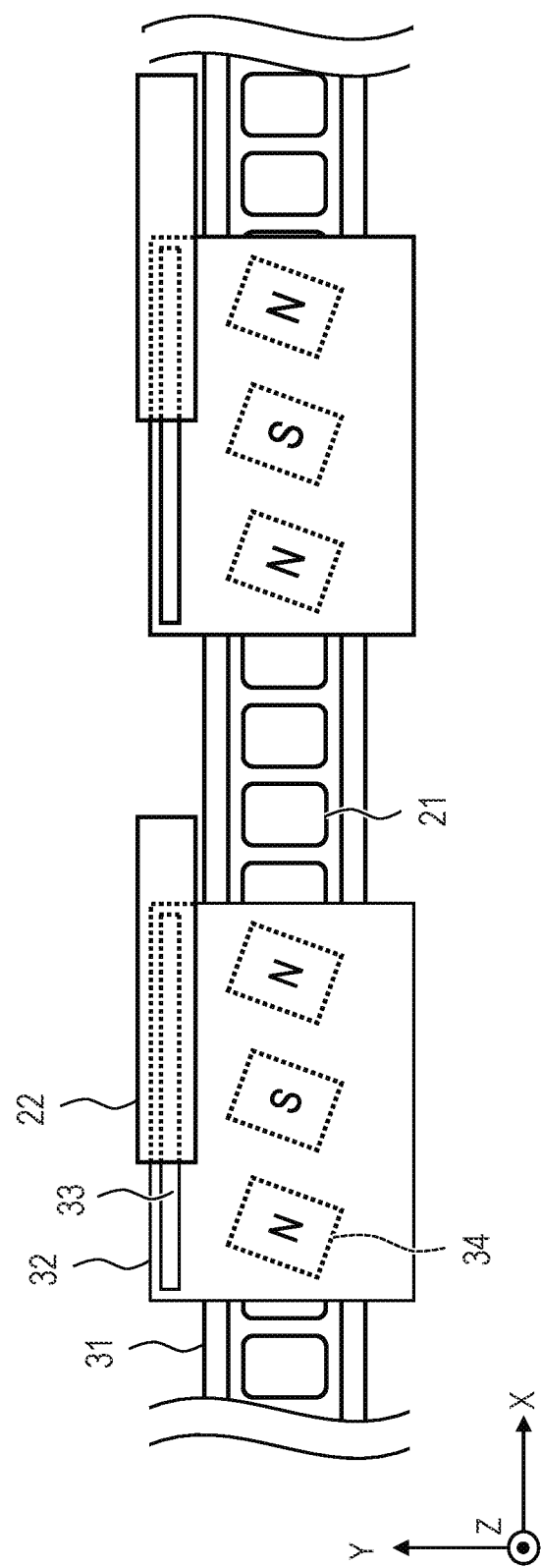
FIG. 1 is a top view illustrating a schematic configuration of a transport apparatus according to a first embodiment of the present disclosure.

Preferred embodiments of the present disclosure will now be described in detail in accordance with the accompanying drawings. The same or corresponding elements are denoted by a common reference numeral throughout the drawings and the description thereof may be omitted or simplified. A plurality of the same or corresponding components may be distinguished by appending alphabets as identifiers at the ends of the same reference numerals. In the case where it is not necessary to separately explain the same components, the identifiers may be omitted and the reference numeral only with a number may be used.

First Embodiment

First, a schematic configuration of a transport apparatus according to the present embodiment will be described with reference to FIG. 1 to FIG. 3. The transport apparatus according to the present embodiment is a moving magnet (MM) type transport apparatus using a linear electric motor in which magnets are installed in a mover and coils are installed in a stator.

FIG. 1 is a top view illustrating a schematic configuration of the transport apparatus according to the present embodiment. FIG. 2 is a sectional view illustrating a schematic configuration of the transport apparatus according to the present embodiment. FIG. 1 is a top view in which the transport apparatus is viewed from a Z direction. FIG. 2 is a cross-sectional view in which an XZ cross-section of the transport apparatus is viewed from a Y direction. FIG. 3 is a circuit diagram illustrating connections between the coil, a current detector, and a voltage detector.

Figure 2:
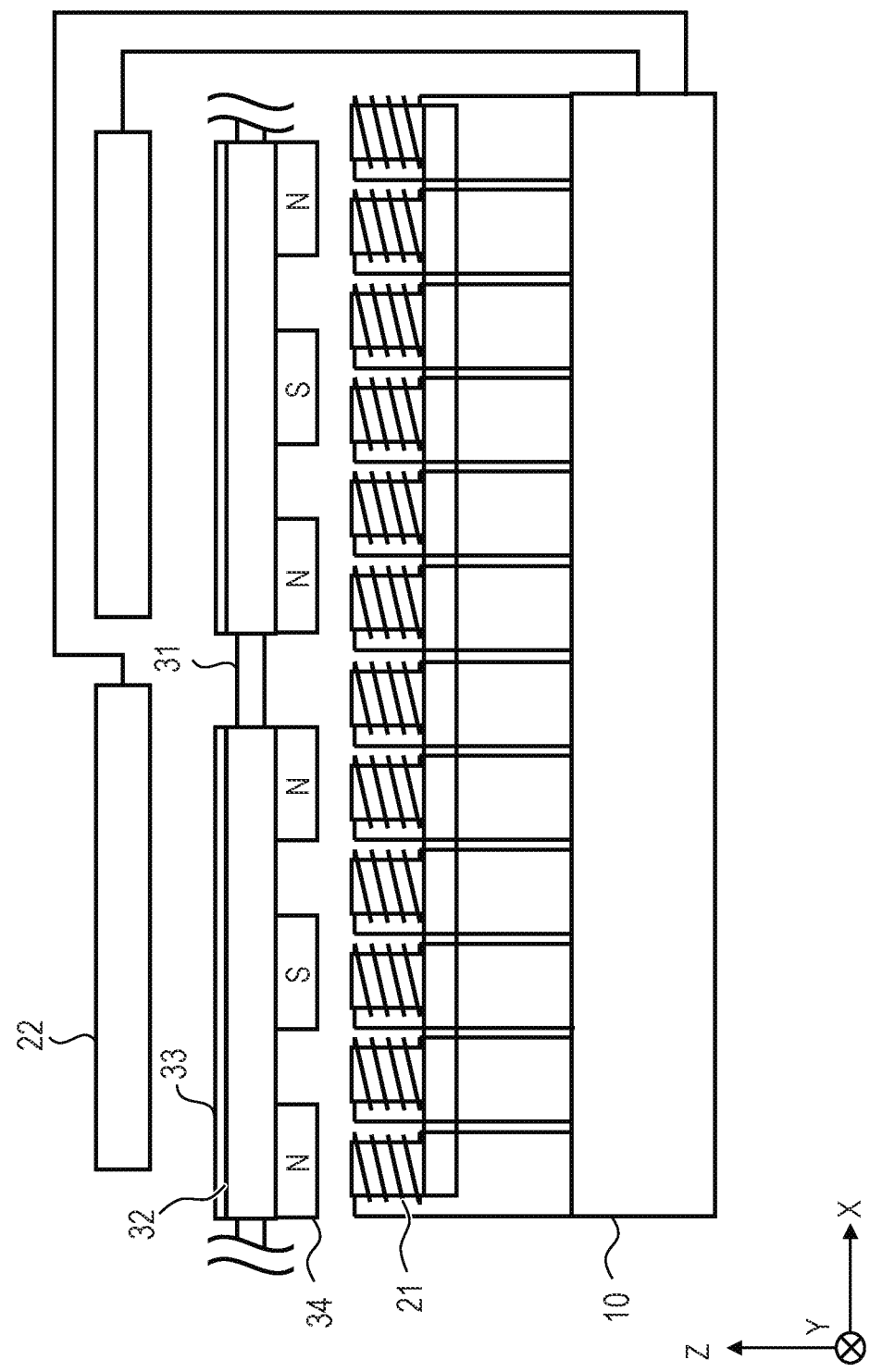
FIG. 2 is a sectional view illustrating a schematic configuration of the transport apparatus according to the first embodiment of the present disclosure.
Figure 3:
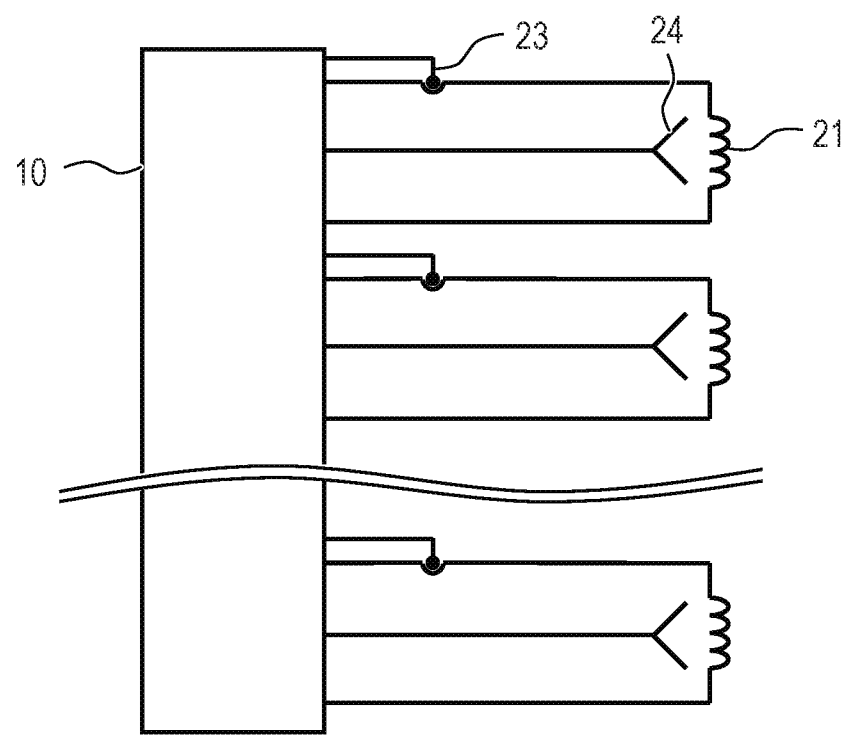
FIG. 3 is a circuit diagram illustrating connections between a coil, a current detector, and a voltage detector according to the first embodiment of the present disclosure.

As shown in FIG. 1 to FIG. 3, the transport apparatus according to the present embodiment includes a control device 10, coils 21, position detectors 22, current detectors 23, voltage detectors 24, a linear guide 31, movers 32, scales 33, and magnets 34. The transport apparatus is an apparatus for transporting articles. The transport apparatus constitutes a part of a processing system for processing workpieces transported by the movers 32.

The mover 32 functions as a carrier of the transport apparatus. The mover 32 is configured so that an article such as a workpiece can be placed or held on its upper surface. The number of the movers 32 is not limited to two as shown in FIG. 1 and FIG. 2, but may be one or may be three or more. The workpiece transported by the mover 32 is processed by a processing apparatus (not shown) to manufacture an article.

An XYZ coordinate system, which is an orthogonal coordinate system shown in FIG. 1 and FIG. 2, will be described. A horizontal direction in which the mover 32 moves is defined as the X-axis. A vertical direction out of directions orthogonal to the X axis is defined as the Z axis, and a direction orthogonal to the X axis and the Z axis is defined as the Y axis. Note that the moving direction of the mover 32 is not necessarily horizontal, but in this case, the Y axis and the Z axis can be appropriately determined to be orthogonal to the X axis with the moving direction as the X axis.

A plurality of magnets 34 are mounted on the under face (the face on the negative side of the Z axis) of the mover 32 so as to be aligned in the X-axis direction. The plurality of magnets 34 are mounted so that the polarities of the outer magnetic poles facing downward (the negative direction of the Z axis) are alternately different, that is, the N poles and the S poles are alternately arranged downward. The number of the plurality of magnets is not particularly limited, and can be changed as appropriate. The magnet 34 may typically be a permanent magnet, but may also be an electromagnet. In the following description, each of the magnets 34 is assumed to be a permanent magnet.

Each of the plurality of coils 21 is a single-phase coil in the present embodiment and functions as an armature for driving the mover 32. The plurality of coils 21 are arranged along the moving direction of the mover 32, that is, the X-axis direction. The plurality of coils 21 and the plurality of magnets 34 are mounted so as to face each other in the Z-axis direction. By applying a current to each of the plurality of coils 21, forces are generated between the plurality of coils 21 and the plurality of magnets 34. Thus, the thrust acts on the mover 32, and the mover 32 moves in the X-axis direction along the linear guide 31. In this way, the plurality of coils 21 and the linear guide 31 constitute a transport path of the mover 32.

A plurality of position detectors 22 for detecting the position of the mover 32 are mounted above the plurality of coils 21 and the linear guide 31 (in the positive direction of the Z axis). The position detector 22 is a linear encoder, for example. The position detector 22 measures a relative distance between the position detector 22 and the mover 32 by reading the pattern of a scale 33 attached to the mover 32. Since the position of the position detector 22 is known, the position of the mover 32 can be detected based on the position of the position detector 22 and the measured relative distance between the position detector 22 and the mover 32. The positions where the position detector 22 and the scale 33 are mounted are not limited to those shown, and are sufficient if the position of the mover 32 can be detected.

As shown in FIG. 3, a current detector 23 is provided in a wiring to which each of the plurality of coils 21 is connected, and detects a current flowing through each of the plurality of coils 21. The voltage detector 24 is provided in the wiring to which each of the plurality of coils 21 is connected, and detects a voltage applied to both ends of each of the plurality of coils 21. The voltage detector 24 may actually measure the voltage applied to the both ends of the coil 21, or it may acquire a command voltage calculated inside the control device 10.

The control device 10 has a function of controlling the current flowing through the plurality of coils 21, a function of controlling the position detector 22, the current detector 23 and the voltage detector 24, and a function of arithmetic operation necessary for these controls. Thus, the control device 10 performs control for moving the plurality of movers 32 to desired positions. The control device 10 may be a single controller or a system that includes a plurality of controllers such as a coil controller that controls a plurality of coils 21, a sensor controller that controls various detectors, and a transport controller that controls the entire transport apparatus.

Based on the position of the mover 32 acquired by the position detector 22, the control device 10 controls the current flowing through each of the plurality of coils 21 so that the desired thrust acts on the mover 32. As shown in FIG. 2 and FIG. 3, the control device 10 can individually control the currents flowing through the plurality of coils 21, so that the plurality of movers 32 can be individually controlled even when the number of movers 32 is plural.

Thrusts each of which acts on corresponding one of the plurality of movers 32 are collectively referred to as a thrust vector F, and current values each of which flows in corresponding one of the plurality of coils 21 facing the plurality of movers 32 are collectively referred to as a current vector I. The thrust vector F is a vector having the number of elements (dimension) of a plurality of movers 32, and the current vector I is a vector having the number of elements of the plurality of coils 21. At this time, the relationship between the thrust vector F and the current vector I is expressed by the following Equation (1) using a thrust constant matrix Kt.

$$F = Kt * I \quad (1)$$

Here, the number of rows of the thrust constant matrix Kt is equal to the number of elements of the thrust vector F, and the number of columns of the thrust constant matrix Kt is equal to the number of elements of the current vector I. Each element of the thrust constant matrix Kt represents the thrust acting on the mover 32 corresponding to the row number of the element when a unit current flows through the coil 21 corresponding to the column number of the element. The thrust constant matrix Kt changes according to the positions of each of the plurality of movers 32.

Next, a method of measuring the resistance of the coil 21 in the transport apparatus according to the present embodiment will be described with reference to FIG. 4 to FIG. 6. The control device 10 according to the present embodiment has a function of measuring the resistance of each of the plurality of coils 21. Prior to the description of the specific measuring method, the purpose of measuring the resistance and the like will be briefly described.

In general, coil windings included in electric motors mounted on transport apparatuses or the like are provided with insulating coatings such as enamel. In order to reduce the deterioration of the insulation coating, it is necessary to control the electric motor so that the operating temperature of the electric motor does not exceed the heat-resistant temperature of the insulation coating. It is known that the resistances of metal materials such as copper used for the windings vary substantially linearly depending on the temperature, and the temperatures of the coils can be estimated by measuring the resistances of the coils. In addition, since abnormalities such as short circuit and disconnection of the windings also cause changes in resistance, the occurrence of these abnormalities can be estimated by measuring the resistances of the coils.

The resistance measured by the control device 10 according to the present embodiment can be used in at least one of the above applications, but is not limited to these applications. In this specification, the measured "resistance" of the coil 21 may include a reactance component due to inductance of the coil 21 or the like, as well as a pure resistance measured by a direct voltage and a direct current. Further, not only the pure resistance of the coil 21 but also the reactance component may be measured. Therefore, in the following description, the more general term "impedance" is used instead of "resistance" except for the case of referring to a pure resistance.

Figure 4:
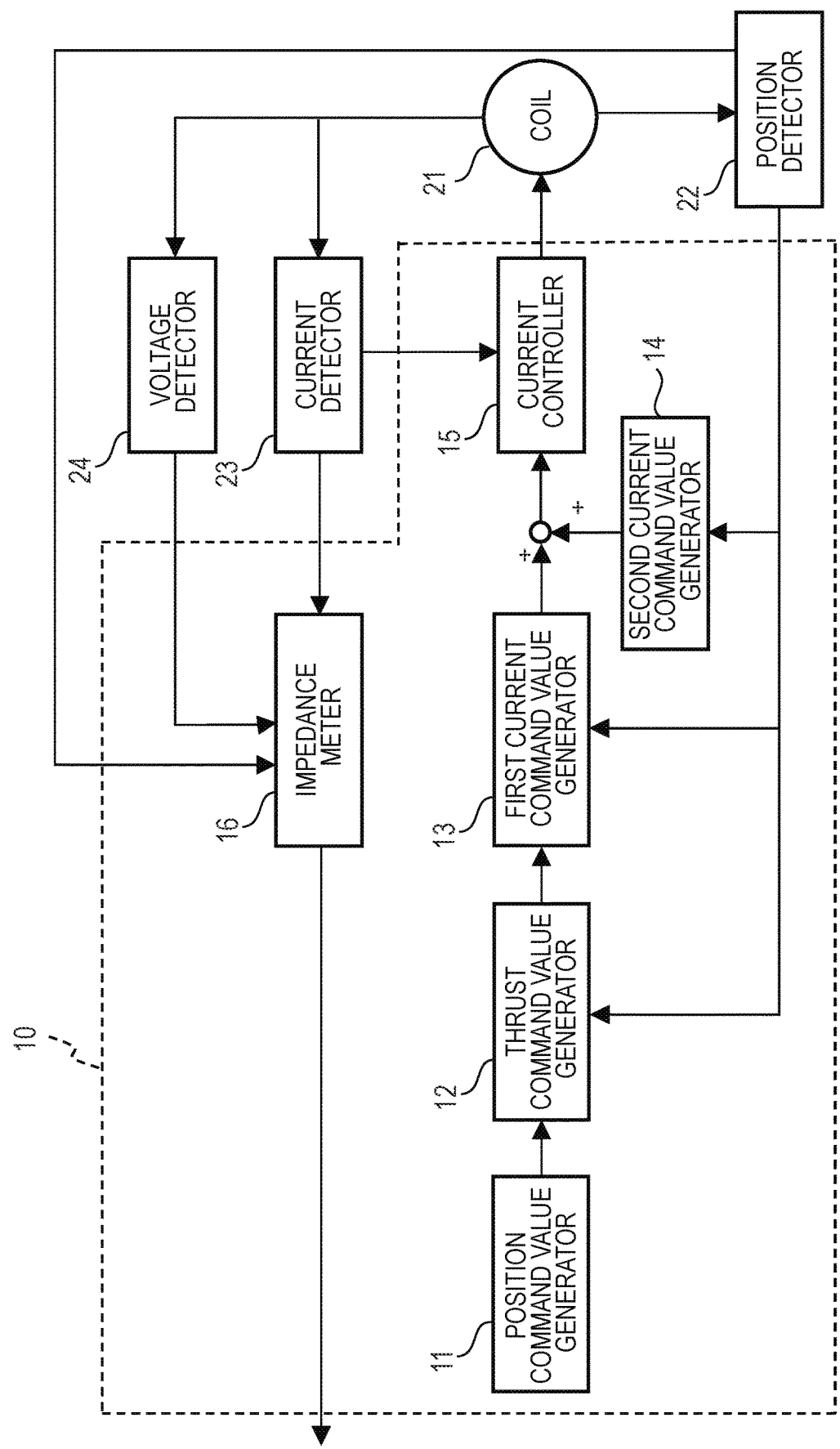
FIG. 4 is a block diagram illustrating a schematic configuration of the transport apparatus according to the first embodiment of the present disclosure.

FIG. 4 is a block diagram illustrating a schematic configuration of the transport apparatus according to the present embodiment. As shown in FIG. 4, the control device 10 includes a position command value generator 11, a thrust command value generator 12, a first current command value generator 13, a second current command value generator 14, a current controller 15, and an impedance meter 16. Note that some or all of the position command value generator 11, the thrust command value generator 12, the first current command value generator 13, the second current command value generator 14, and the current controller 15 may be referred to as a control unit. The impedance meter 16 may also be referred to as a measuring unit.

Figure 5:
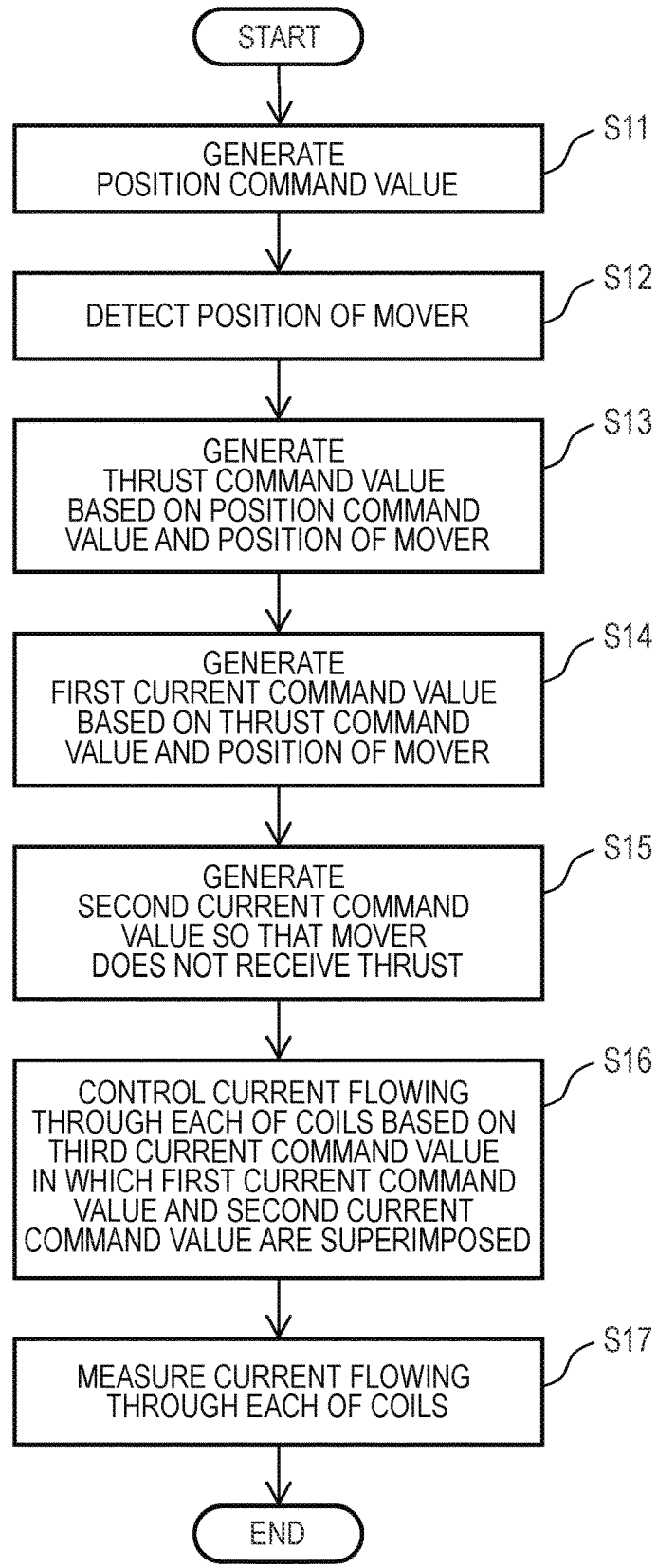
FIG. 5 is a flowchart schematically illustrating an operation of the transport apparatus according to the first embodiment of the present disclosure.

FIG. 5 is a flowchart schematically illustrating the operation of the transport apparatus according to the present embodiment. With reference to the flowchart of FIG. 5, the impedance measurement operation performed by each of the blocks shown in FIG. 4 will be outlined.

In step S11, the position command value generator 11 generates a position command value for moving the mover 32 to a desired position based on an operation from a user or a preset operation.

In step S12, the position detector 22 detects the current position of the mover 32. The position information of the mover 32 thus obtained can be supplied to the thrust command value generator 12, the first current command value generator 13, the second current command value generator 14, and the impedance meter 16. The order of steps S11 and S12 may be reversed, or steps S11 and S12 may be performed in parallel.

In step S13, the thrust command value generator 12 calculates and generates a thrust command value indicating a thrust acting on the mover 32 based on the position command value generated by the position command value generator 11 and the position of the mover 32 measured by the position detector 22. The thrust is determined such that the mover 32 moves from the current position toward the position indicated by the position command value. For example, a PID controller may be used to calculate the thrust.

In step S14, the first current command value generator 13 determines a first current command value indicating a current to be supplied to each coil 21 based on the thrust command value generated by the thrust command value generator 12 and the position of the mover 32 measured by the position detector 22. The first current command value is determined so that the mover 32 receives a thrust corresponding to the thrust command value. For example, a relational equation between the thrust vector F and the current vector I shown in the following Equation (2) can be used to calculate the first current command value.

$$I = Kt^{<+>} * F \quad (2)$$

where $Kt^{<+>}$ is the pseudo inverse matrix of the thrust constant matrix Kt.

In step S15, the second current command value generator 14 determines a second current command value for supplying impedance measurement currents to the coils 21 in such a combination that the mover 32 does not receive thrust. Such a combination of currents is realized by calculating a current vector ik which belongs to the null space of the thrust constant matrix Kt and is a non-zero vector, and making the current vector ik a second current command value. Since the current vector ik belongs to the null space of the thrust constant matrix Kt, the mover 32 does not receive any thrust due to the component corresponding to the second current command value. Therefore, even if the current vector ik is superimposed on the driving current vector I for generating the thrust vector F corresponding to the first current command value, the sum of the thrust applied to the mover 32 by the plurality of coils 21 is not affected.

The condition for the existence of the current vector ik, which is a non-zero vector in the null space of the thrust constant matrix Kt, is the existence of a plurality of solutions of the current vector I which generate a predetermined thrust vector F. This condition is easily satisfied when a plurality of magnets 34 are attached to the mover 32 and the currents of the plurality of coils 21 can be individually controlled, as in the transport apparatus of FIG. 1 and FIG. 2.

As an example of a method of calculating the current vector ik, there is a method using the following Equation (3), for example, by using an arbitrary non-zero vector η having the number of elements equal to I, the thrust constant matrix Kt, its pseudo inverse matrix $Kt^{<+>}$, and a unit matrix E.

$$ik = (E - Kt^{<+>} * Kt) * \eta \quad (3)$$

The magnitude of the current vector ik may be appropriately adjusted so as to be suitable for the following impedance measurement by performing operations such as normalization and constant multiplication on the calculation result of the current vector ik as required. According to the arbitrariness of η in Equation (3), the current vector after these operations also belongs to the null space of the thrust constant matrix Kt.

In step S16, the current controller 15 controls the currents flowing through the coils 21 based on a third current command value obtained by superimposing the first current command value and the second current command value. This process may, for example, control the currents so that the current values given by the sum of Equations (2) and (3) flow through the coils 21. The current controller 15 determines a voltage to be applied to each coil 21 by a PI controller, for example, and performs control so that the current of each coil 21 indicated by the third current command value and the current detected by the current detector 23 coincide with each other.

Figure 6:
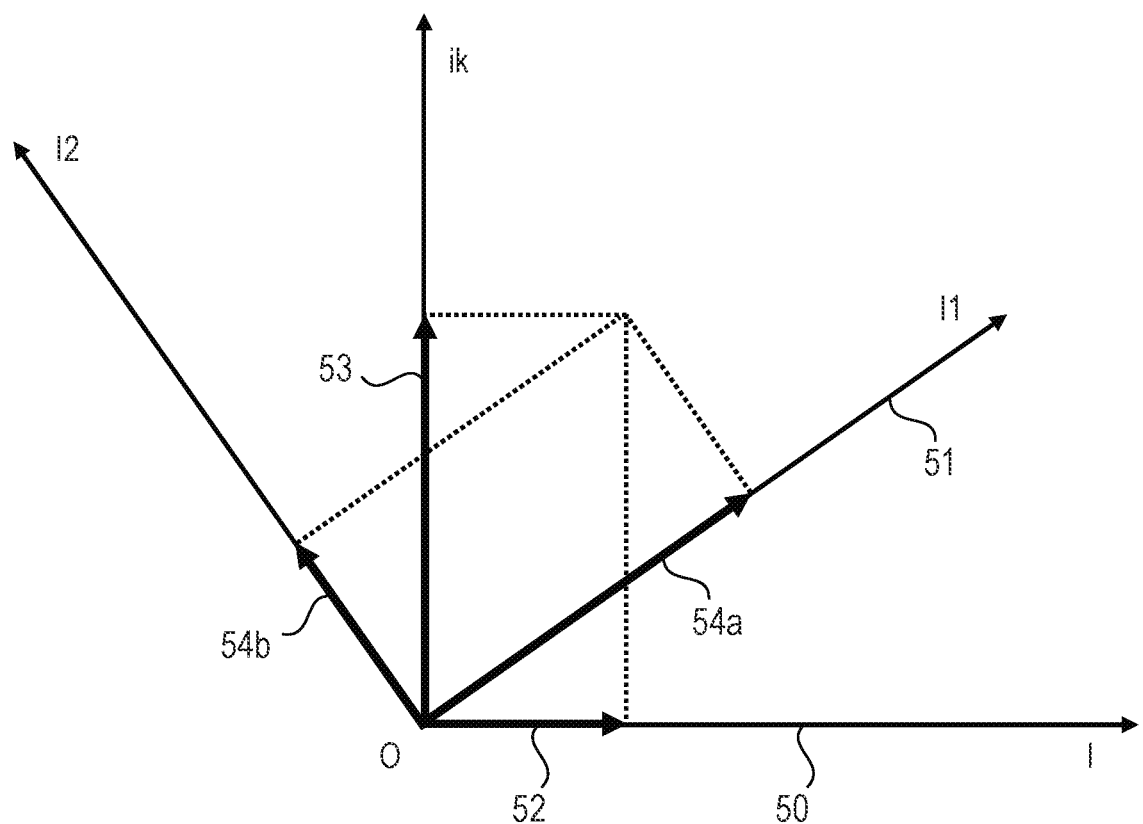
FIG. 6 is a vector diagram schematically illustrating current calculation in the transport apparatus according to the first embodiment of the present disclosure.

Referring to FIG. 6, an example of current calculation based on Equations (2) and (3) will be described using a simplified model. FIG. 6 is a vector diagram schematically illustrating the current calculation in the transport apparatus according to the present embodiment.

FIG. 6 shows an example of a current vector in the case where the number of movers 32 is one and the number of coils 21 is two on a two-dimensional plane. At this time, the thrust vector F is a vector in which the number of elements is one, the current vector I is a vector in which the number of elements is two, and the thrust constant matrix Kt is a matrix of one row and two columns. The elements of the thrust constant matrix Kt are Kt1 and Kt2. Note that the number of elements described above is a simplified example for purposes of explanation, and may be larger than described above in practice. The number of elements may be other combinations if the condition described above for the existence of the current vector ik, which is a non-zero vector in the null space of the thrust constant matrix Kt, that is, the existence of a plurality of solutions of the current vector I generating the predetermined thrust vector F is satisfied.

FIG. 6 shows a first coordinate system 50 indicated by O-I-ik, and a second coordinate system 51 indicated by O-I1-I2. The first coordinate system 50 is a coordinate system related to the thrust vector acting on the mover 32. The I axis in the horizontal direction corresponds to a current for applying thrust to the mover 32. The ik axis in the vertical direction corresponds to the current for the impedance measurement. That is, the current vector I calculated by Equation (2) corresponds to a vector 52 in FIG. 6, and the current vector ik calculated by Equation (3) corresponds to a vector 53 in FIG. 6.

The second coordinate system 51 is a coordinate system corresponding to the current flowing through each coil 21. The I1 axis corresponds to a current flowing through the first coil 21 of the two coils 21. The I2 axis corresponds to a current flowing through the second coil 21 of the two coils 21. The slope of O-I1 with respect to the first coordinate system 50 is expressed as −Kt2/Kt1 using the elements of the thrust constant matrix Kt.

The current controller 15 determines a current flowing through each coil 21 based on the sum of the vector 52 based on the first current command value and the vector 53 based on the second current command value and performs control. The currents flowing through coils 21 correspond to a vector 54a on the I1 axis and a vector 54b on the I2 axis, respectively. As can be understood from FIG. 6, the component obtained by projecting the sum of the vectors 52 and 53 on the I1 axis is the vector 54a, and the component obtained by projecting the sum on the I2 axis is the vector 54b.

In step S17, the current detector 23 measures the current i flowing through each of the plurality of coils 21, and the voltage detector 24 measures the voltage v across each of the plurality of coils 21. The impedance meter 16 acquires the speed w of the mover 32. The method of acquiring the speed w may be based on, for example, a temporal change in the position of the mover 32. Specifically, the impedance meter 16 acquires the position of the mover 32 measured by the position detectors 22 at a plurality of times, and calculates the speed w of the mover 32 at a position facing each of the plurality of coils 21 based on the time change of the position.

In step S17, the impedance meter 16 calculates the impedance of each of the plurality of coils 21 based on the current i, the voltage v, the speed w, and the counter electromotive force constant Kv of each of the plurality of coils 21. The impedance can be calculated by the following Equation (4) when the resistance R is measured by direct current, for example. Equation (4) is not an arithmetic operation of a matrix or a vector, but an arithmetic operation of each element performed to each of the plurality of coils 21.

$$R=(v-Kv*w)/i \quad (4)$$

When the voltage v and the current i described above have alternate current components, the resistance R, which is the calculation result of Equation (4), may include not only a resistance component of the coil 21 but also an inductance component. Generally, the time constant of the temperature change in the coil 21 is longer than the electrical time constant. The effect of the inductance component is small in the low frequency region and large in the high frequency region. Therefore, the calculation result of Equation (4) may be processed by a filter such as a low-pass filter, thereby reducing the influence of the inductance component.

Note that Equation (4) may be modified so that the resistance R can be calculated separately from the inductance component by adding a term of the induced voltage due to the inductance component to Equation (4). Equation (4) may be modified to be able to calculate the impedance including the resistance component and the reactance component for the voltage v and the current i having alternate current components.

If it is known that the back electromotive force produces only an alternate current component, a filter can remove the effect of the back electromotive force as well as the effect of the inductance component. Therefore, the term Kv*w of the speed electromotive force can be removed from Equation (4). In this case, the calculation is simplified.

As described above, in the current control in the present embodiment, the second current command value indicating the currents for the impedance measurement is superimposed on the first current command value indicating the driving currents to control the currents flowing through the coils 21. That is, the current for impedance measurement can be superimposed on the current flowing through the coils 21 by processing in the control device 10 without providing an additional current supply circuit. Accordingly, provided are the control device 10 and the transport apparatus capable of measuring the impedance of the electric motor with a small restriction on circuit configuration.

Further, the impedance measurement accuracy can be improved by superimposing the first current command value and the second current command value and increasing the current amount of each of coils 21. Since the currents for the impedance measurement flow through each of coils 21, the impedance measurement can be realized even when the driving current is zero. At this time, the currents for the impedance measurement are calculated so as to belong to the null space of the thrust constant matrix Kt so that the mover 32 does not receive the thrust. Therefore, the influence of the currents for the impedance measurement flowing through each of coils 21 on the thrust of the mover 32 is reduced. Thus, for example, even when the impedance measurement is performed during the operation of the transport apparatus, the influence of the impedance measurement current on the operation of the transport apparatus is reduced.

Further, in the method according to the present embodiment, since the current for the impedance measurement can be individually supplied to each of the plurality of coils 21, the impedance of each of the plurality of coils 21 can be individually acquired.

The current waveform of the current vector ik based on the second current command value may have a direct current section in at least a part of the period when the two current command values are superimposed. As described above, the measurement accuracy of the impedance calculated by Equation (4) or the like may be deteriorated due to the influence of the alternate current component. By providing a direct current section in the waveform of the current vector ik, the influence of the alternate current component is reduced, and the measurement accuracy of the impedance can be improved. Examples of waveforms having direct current sections include direct current waveforms, step waveforms, and the like.

The process of superimposing the second current command value on the first current command value may always be performed during the operation of the coil 21, but the above effects can be obtained if performed at least during the measurement of the impedance. For example, the process of superimposing the second current command value on the first current command value may be performed only during a period in which the impedance measurement is performed during operation of the coil 21.

The process of superimposing the second current command value on the first current command value may be performed only when a predetermined condition is satisfied. The predetermined condition may be determined based on the first current command value. Specifically, the above-described process of superimposing may be performed when the driving current is equal to or less than a threshold value, or the above-described process of superimposing may be performed when the driving current continues a state in which the driving current is equal to or less than a threshold value for a threshold time or more. When the driving current is sufficiently large, since the impedance measurement can be performed by the driving current, the effect of reducing the power consumption and the heat generation due to the impedance measurement current can be obtained by not considering the second current command value as described above.

When there are a plurality of candidates of the currents for the impedance measurement calculated by the processing of Equation (3) or the like, the plurality of candidates may be switched in accordance with periods to flow the currents through the coils 21. For example, the second current command value may be generated such that the currents for the impedance measurement flow through a first group of the coils 21 in a first period, and the second current command value may be generated such that the currents for the impedance measurement flow through a second group of the coils 21 different from the first group in a second period. By changing the group of the coils 21 through which the impedance measurement currents flow in accordance with periods, the influence on the thrust received by the mover 32 can be further reduced as compared with the case in which the currents for the impedance measurement flow through all the coils 21 simultaneously.

Second Embodiment

A transport apparatus according to a second embodiment will be described with reference to FIG. 7 to FIG. 9. The difference from the transport apparatus according to the first embodiment is the processing procedure of current control. The structure of the transport apparatus according to the present embodiment is the same as that of the first embodiment, and therefore the description thereof is omitted. The same components as those of the transport apparatus according to the first embodiment are denoted by the same reference numerals, and the description thereof may be omitted or simplified.

In the first embodiment, the current vector ik for the impedance measurement that belongs to the null space of the thrust constant matrix Kt is explicitly obtained and superimposed on the current vector I for driving. On the other hand, in the present embodiment, after determining the coils 21 to be superimposed with the currents for the impedance measurement and the currents to be superimposed, the remaining driving current is calculated so as to generate a desired thrust according to the thrust command value.

Figure 7:
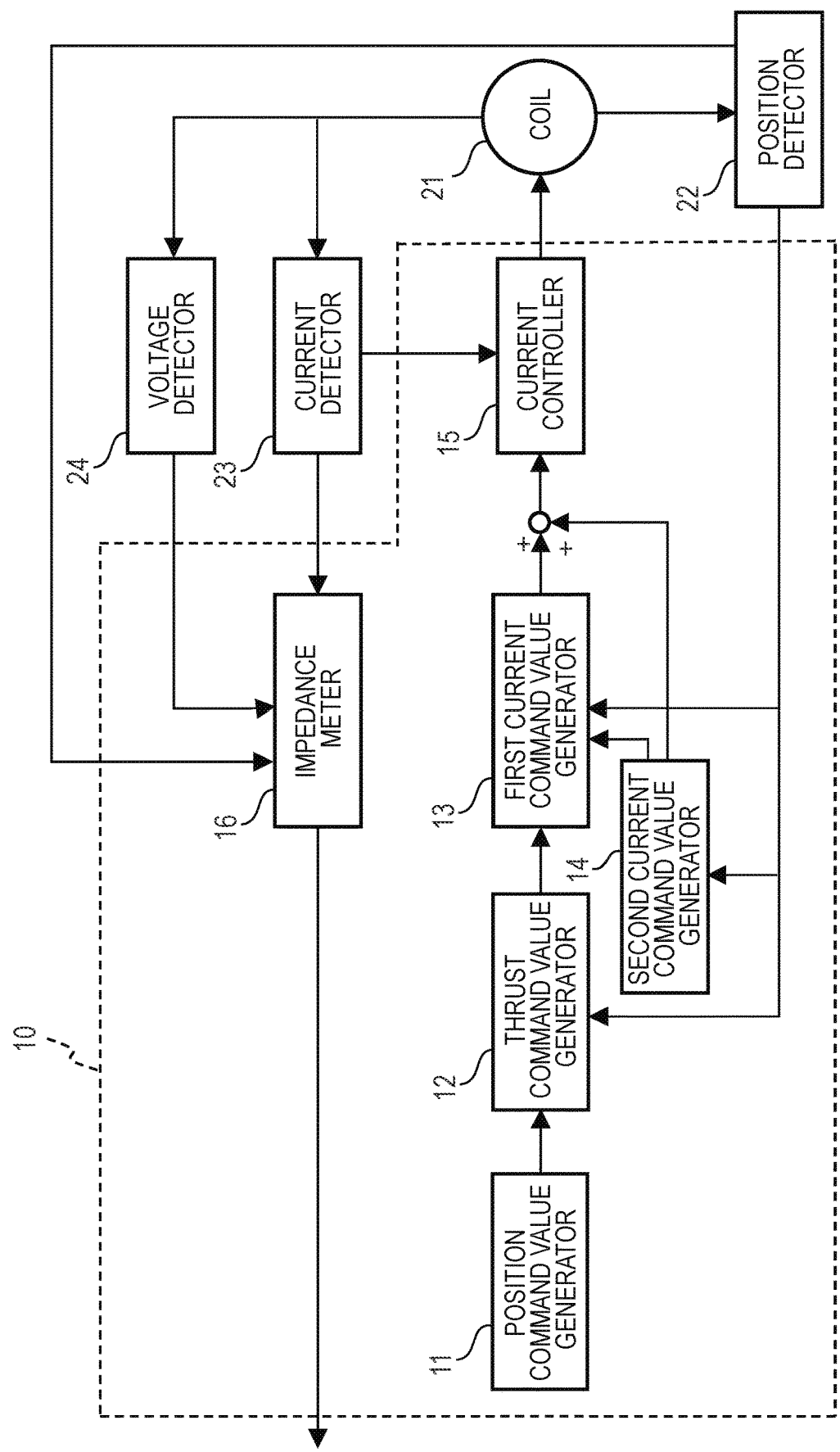
FIG. 7 is a block diagram illustrating a schematic configuration of a transport apparatus according to a second embodiment of the present disclosure.

FIG. 7 is a block diagram illustrating a schematic configuration of the transport apparatus according to the present embodiment. The blocks shown in the block diagram of FIG. 7 are similar to those of FIG. 4. However, the difference from the first embodiment is that the second current command value output from the second current command value generator 14 is also input to the first current command value generator 13.

Figure 8:
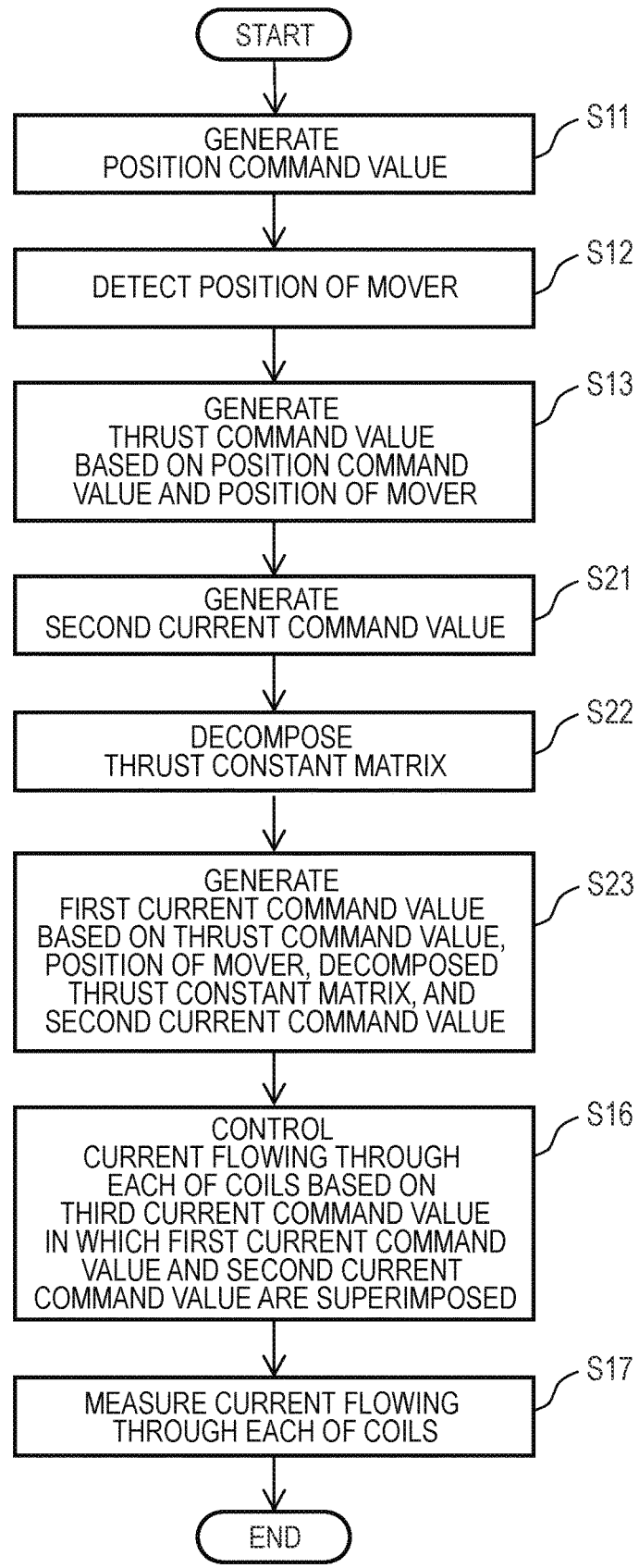
FIG. 8 is a flowchart schematically illustrating an operation of the transport apparatus according to the second embodiment of the present disclosure.

FIG. 8 is a flowchart schematically illustrating the operation of the transport apparatus according to the present embodiment. With reference to the flowchart of FIG. 8, the impedance measurement operation performed by each of the blocks shown in FIG. 7 will be outlined. Since steps S11, S12, S13, S16, and S17 in FIG. 8 are substantially the same as those in the first embodiment, the description thereof is omitted or simplified.

In step S21, the second current command value generator 14 determines the coils 21 to be superimposed with the currents for the impedance measurement and the second current command value including the currents I1 for the impedance measurement current that flow through these coils 21.

In step S22, the first current command value generator 13 decomposes the thrust constant matrix Kt into two of the thrust constant matrix Kta and the thrust constant matrix Ktb based on the determined currents I1 for the impedance measurement. The thrust constant matrix Kta is a matrix consisting of columns relating to the coils 21 to be superimposed with the currents for the impedance measurement. The thrust constant matrix Ktb is a matrix containing at least a column for all of the remaining coils 21. In order to obtain a solution of the current vector that produces the desired thrust vector F according to the position command value, the thrust constant matrix Kt2 is selected such that the column rank of the thrust constant matrix Kt2 is equal to or higher than the row rank of the desired thrust vector F. At this time, the thrust constant matrix Kt2 may include a column relating to the coils 21 to be superimposed with the currents for the impedance measurement.

In step S23, the first current command value generator 13 generates a first current command value using the thrust command value, the position of the mover 32, the thrust constant matrix Kta, the pseudo inverse matrix Ktb<+> of Ktb, and the current vector I1 corresponding to the second current command value. The current vector I2 for driving based on the first current command value can be calculated by the following Equation (5).

$$I2 = Ktb<+>*(F - Kta*I1) \quad (5)$$

In step S16, the current controller 15 controls the currents flowing through the coils 21 based on the third current command value obtained by superimposing the first current command value and the second current command value. This process may, for example, control the current so that the current value given by the sum of the current vector I1 for the resistance measurement and the current vector I2 for driving flows through the coils 21.

Here, an example of the current calculation based on Equation (5) will be described with reference to FIG. 9 using a simplified model. FIG. 9 is a vector diagram schematically illustrating the current calculation in the transport apparatus according to the present embodiment. In FIG. 9, the preconditions such as the number of the mover 32 and the coil 21, the number of vector elements, and the number of matrix elements are the same as those in FIG. 6, and therefore description thereof will be omitted.

Figure 9:
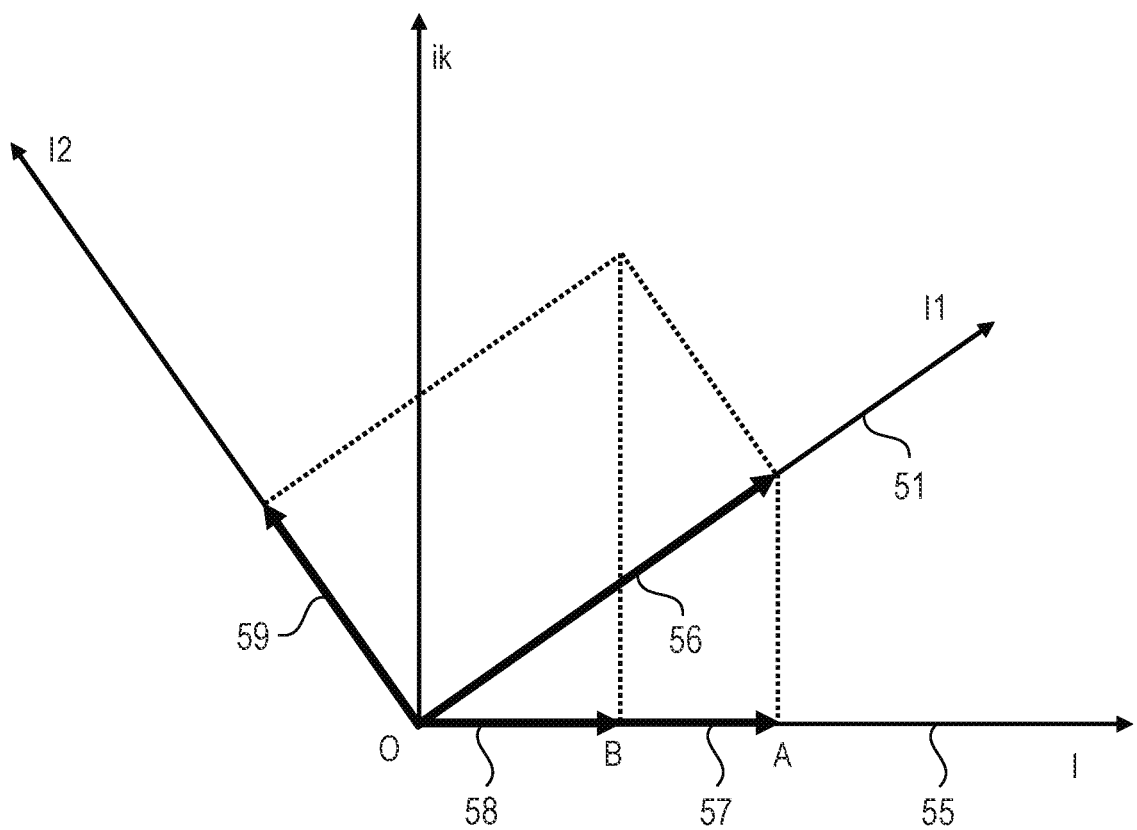
FIG. 9 is a vector diagram schematically illustrating current calculation in the transport apparatus according to the second embodiment of the present disclosure.

FIG. 9 shows a first coordinate system 55 indicated by O-I-ik, and a second coordinate system 51 indicated by O-I1-I2. The first coordinate system 55 is a coordinate system related to the thrust vector acting on the mover 32. The I axis in the horizontal direction corresponds to a current for applying thrust to the mover 32. The ik axis in the vertical direction corresponds to the current for the impedance measurement.

The second coordinate system 51 is a coordinate system corresponding to the current flowing through each coil 21. The I1 axis corresponds to a current flowing through the first coil 21 of the two coils 21. The I2 axis corresponds to a current flowing through the second coil 21 of the two coils 21. The slope of O-I1 with respect to the first coordinate system 55 is expressed as −Kt2/Kt1 using the elements of the thrust constant matrix Kt.

The second current command value generator 14 determines a current vector 56 for the impedance measurement to flow to the coils 21 of an impedance measurement object. Next, as shown in Equation (5), the first current command value generator 13 calculates a current vector 59 flowing through the remaining coils 21 using the difference between a current vector 57 (vector OA in FIG. 9) and a current vector 58 (vector OB in FIG. 9). Here, the current vector 57 is a vector consisting only of components relating to the thrust acting on the mover 32 in the current vector 56. The current vector 58 is a vector indicating a current required to apply a desired thrust to the mover 32.

As described above, in the current control in the present embodiment also, as in the first embodiment, the second current command value indicating the currents for the impedance measurement is superimposed on the first current command value indicating the driving currents to control the currents flowing through the coils 21. Therefore, as in the first embodiment, provided are the control device 10 and the transport apparatus capable of measuring the impedance of the electric motor with a small restriction on circuit configuration.

In the present embodiment, since the current for the impedance measurement flows through each of the coils 21, the impedance measurement can be realized even when the driving current is zero. At this time, the total current flowing through each of the coils 21 is determined such that a desired thrust corresponding to the thrust command value is generated after two currents based on the first current command value and the second current command value are superimposed. That is, since the first current command value is determined so that the coils 21 do not receive extra thrusts due to the currents for the impedance measurement, the influence on the thrust of the mover 32 due to the flow of the current for the impedance measurement to each of the coils 21 is reduced also in the present embodiment.

Further, in the present embodiment as well as in the first embodiment, since the current for the impedance measurement can be individually supplied to each of the plurality of coils 21, the impedance of each of the plurality of coils 21 can be individually acquired.

The current waveform of the current vector I1 based on the second current command value may have a direct current section in at least a part of the period when the two current command values are superimposed. For the same reason as described in the first embodiment, the influence of the alternate current component can be reduced, and the measurement accuracy of the impedance can be improved.

The second current command value may be generated such that the currents for the impedance measurement flow through a first group of the coils 21 in a first period, and the second current command value may be generated such that the currents for the impedance measurement flow through a second group of the coils 21 different from the first group in a second period. By changing the group of the coils 21 through which the impedance measurement currents flow in accordance with periods, the influence on the thrust received by the mover 32 can be further reduced as compared with the case in which the currents for the impedance measurement flow through all the coils 21 simultaneously.

Third Embodiment

A transport apparatus according to a third embodiment will be described with reference to FIG. 10 and FIG. 11. A difference from the transport apparatus according to the first embodiment is that three-phase coils are provided as armatures for driving. The same components as those of the transport apparatus according to the first embodiment or the second embodiment are denoted by the same reference numerals, and the description thereof may be omitted or simplified.

Figure 10:
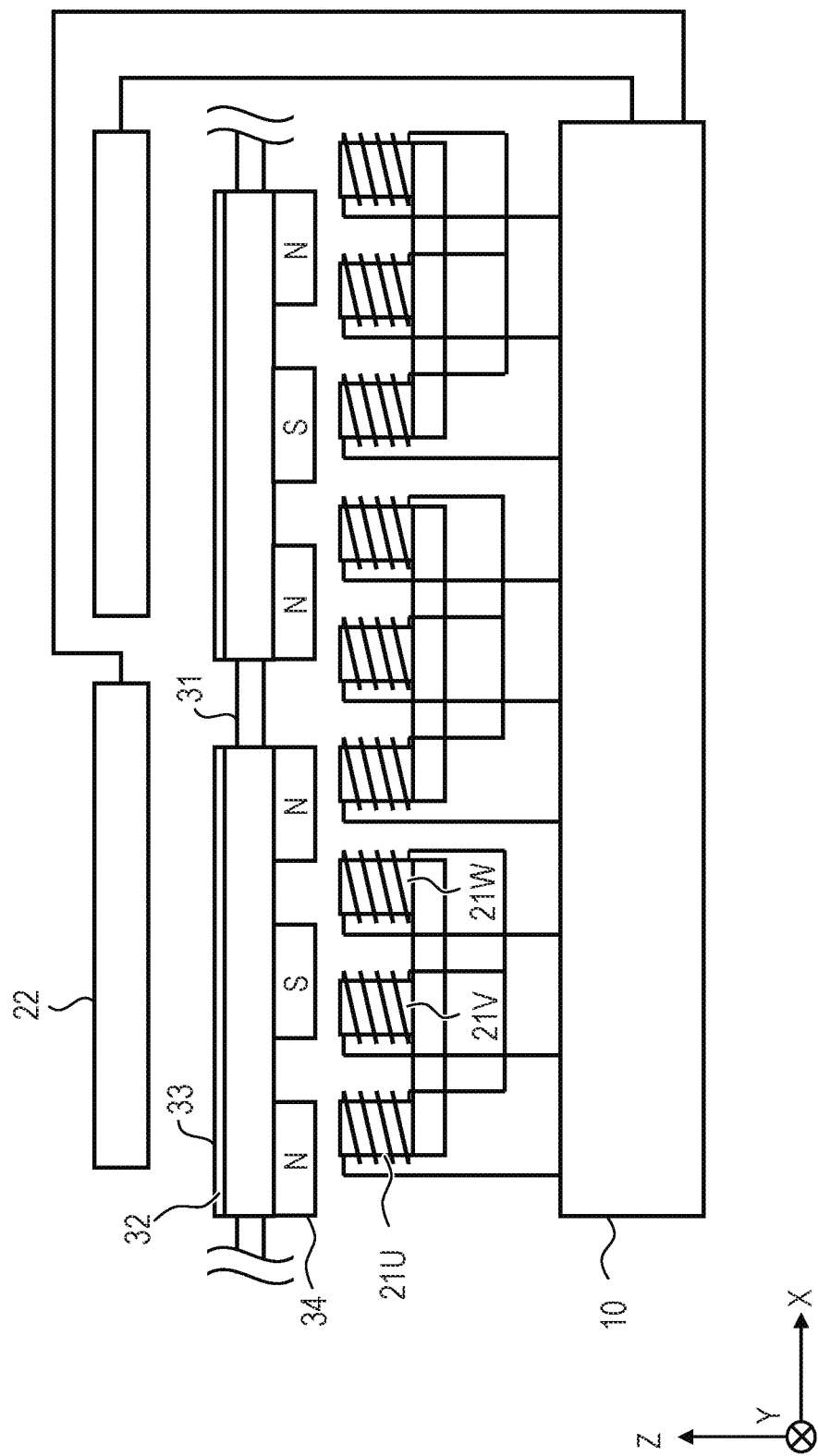
FIG. 10 is a sectional view illustrating a schematic configuration of a transport apparatus according to a third embodiment of the present disclosure.

FIG. 10 is a cross-sectional view in which an XZ cross-section of the transport apparatus is viewed from the Y direction. FIG. 11 is a circuit diagram illustrating connections of the coil, the current detector, and the voltage detector. A top view of the transport apparatus as viewed from the Z direction is the same as that in FIG. 1 and therefore is omitted.

As shown in FIG. 10, the transport apparatus according to the present embodiment includes a plurality of three-phase coils. Each of the three-phase coils has coils 21U, 21V, and 21W. Current flowing through each of the coils 21U, 21V, and 21W is individually controlled by the control device 10.

As shown in FIG. 10, the sizes of the coils 21U, 21V, and 21W and the mover 32 are designed so that two or more coils are always opposed to one mover 32. Therefore, the control device 10 can separately control the thrust acting on each of the movers 32 even when a plurality of the movers 32 are provided.

Figure 11:
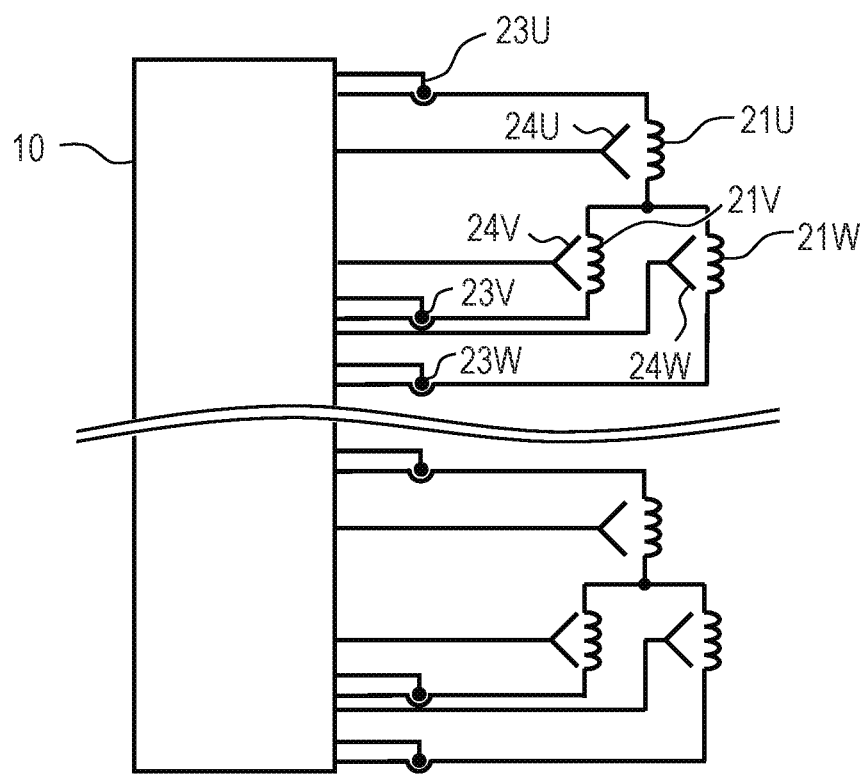
FIG. 11 is a circuit diagram illustrating connections between a coil, a current detector, and a voltage detector according to the third embodiment of the present disclosure.

As shown in FIG. 11, the transport apparatus according to the present embodiment includes current detectors 23U, 23V, and 23W and voltage detectors 24U, 24V, and 24W corresponding to the coils 21U, 21V, and 21W. The current detectors 23U, 23V, and 23W detect phase currents of the coils 21U, 21V, and 21W, respectively. The voltage detectors 24U, 24V, and 24W detect phase voltages of the coils 21U, 21V, and 21W, respectively.

Based on the phase currents detected by the current detectors 23U, 23V, and 23W, the control device 10 applies a voltage to each phase of the three-phase coil so that the currents flowing through the coils 21U, 21V, and 21W become desired values. The voltage detectors 24U, 24V, and 24W may actually measure the phase voltages or obtain the command voltages calculated inside the control device 10. As shown in FIG. 11, the three-phase coil according to the present embodiment does not have a connection end to the neutral point.

When the control device 10 performs current control of a three-phase coil with no connection end to the neutral point, the controllable degree of freedom of currents is two. Therefore, the control device 10 according to the present embodiment controls the transport device by using the conversion between the three-phase current and the two-phase current by, for example, αβ-axis conversion or dq-axis conversion. Further, the control device 10 according to the present embodiment uses the conversion between the three-phase current and the two-phase current to control the currents of the coils 21U, 21V, and 21W in the same manner as in the first embodiment or the second embodiment to measure the impedance.

Specifically, the current vector I in Equation (1) is set as a vector obtained by arranging the two-phase currents of the respective coils. Then, by using Equation (3) or Equation (5), it is possible to calculate a current command value of the two-phase current for applying a desired thrust to the mover 32 and flowing the current for the resistance measurement to each coil.

The control device 10 can calculate the current command value corresponding to each coil by inversely converting the current command value of the two-phase current to the current command value of the three-phase current, and measure the resistance of each coil using Equation (4) as in the first embodiment and the second embodiment.

As described above, according to the present embodiment, the control device 10 and the transport apparatus which can obtain the same effects as those of the first embodiment or the second embodiment are provided even with the device configuration using the three-phase coils.

OTHER EMBODIMENTS

It should be noted that the above embodiments are merely examples of embodiments of the present disclosure, and the technical scope of the present disclosure should not be interpreted in a limited manner. That is, the present disclosure can be practiced in a variety of ways without departing from the technical idea or its essential features. For example, any embodiment in which one or some of the configurations of any embodiment(s) is/are added in another embodiment, or any embodiment in which one or some of the configurations of any embodiment(s) is/are substituted for one or some of the configurations of another embodiment are also to be understood as embodiments to which the present disclosure may be applied.

In the embodiments described above, the linear electric motor in which the magnets are installed in the mover and the coils are installed in the stator is exemplified, but the configuration of the electric motor is not limited thereto. The electric motor may be a linear electric motor in which coils are installed in the mover and magnets are installed in the stator. The electric motor may be a rotary electric motor instead of the linear electric motor.

Further, in the above-described embodiments, the use of the electric motor is exemplified by the transport apparatus, but the use of the electric motor is not limited thereto. The control device 10 according to the above embodiments can be applied to devices other than the transport device by appropriately changing the configuration.

According to the present disclosure, it is possible to provide a transport apparatus, a control device, and a control method capable of measuring the impedance of an electric motor with a small restriction on circuit configuration.

Embodiment(s) of the present disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2020-129551, filed Jul. 30, 2020, which is hereby incorporated by reference herein in its entirety.

What is claimed is:

1. A transport apparatus comprising:
a plurality of coils arranged in a predetermined direction;
moved that is movable in the predetermined direction; and
a control device configured to apply a current to each of the plurality of coils to move the mover in the predetermined direction,
wherein the control device is configured to apply, to each of the plurality of coils, the current including a first component applying a thrust to the mover and a second component measuring an impedance of at least one of the plurality of coils, and
wherein a thrust applied to the mover by the second component is less than the thrust applied to the mover by the first component.

2. The transport apparatus according to claim 1, wherein a current waveform of the second component includes a direct current section in at least a part of a period in which the first component and the second component are superimposed.

3. The transport apparatus according to claim 1,
wherein the plurality of coils and the mover constitute an electric motor, and
wherein the electric motor is a linear electric motor.

4. A processing system comprising:
the transport apparatus according to claim 1; and
a processing apparatus configured to process a workpiece transported by the mover.

5. A method of manufacturing an article using a processing system having the transport apparatus according to claim 1, and a processing apparatus configured to process a workpiece transported by the mover, the method comprising:
transporting the workpiece by the mover; and
processing, by the processing apparatus, the workpiece transported by the mover.

6. The transport apparatus according to claim 1, wherein the control device is further configured to measure the impedance of at least one of the plurality of coils when the mover moves in the predetermined direction.

7. The transport apparatus according to claim 3, wherein the measuring unit further is configured to measure the impedance based on a speed of the mover.

8. The transport apparatus according to claim 1, wherein the control device is further configured to measure the impedance of at least one of the plurality of coils when the mover does not move in the predetermined direction.

9. The transport apparatus according to claim 1,
wherein the current is applied to each of the plurality of coils based on a third current command value,
wherein the third current command value is a value in which a first current command value and a second current command value are superimposed,
wherein the first current command value indicates a current equivalent to the first component corresponding to a thrust command value indicating a thrust applied to the mover,
wherein the second current command value indicates a current equivalent to the second component for measuring the impedance of at least one of the plurality of coils, and
wherein a control unit is configured to determine the second current command value such that the mover does not receive a thrust due to a component corresponding to the second current command value.

10. The transport apparatus according to claim 9, wherein the second current command value includes a non-zero vector that belongs to a null space of a thrust constant matrix showing a relationship between thrust received by the mover and a vector having the currents, each flowing through each of the plurality of coils as elements.

11. The transport apparatus according to claim 9, wherein, in generating current command values, the control unit (i) generates the second current command value in a first period so that currents, for measuring the impedance of at least one of the plurality of coils, flow in a first group of the plurality of coils, and (ii) generates the second current command value in a second period, different from the first period, so that currents, for measuring the impedance of at least one of the plurality of coils, flow in a second group of the plurality of coils different from the first group of the plurality of coils.

12. The transport apparatus according to claim 10,
wherein the plurality of coils includes a three-phase coil, and
wherein the control unit is configured to determine a current of each phase of the three-phase coil by converting the third current command value from a two-phase to a three-phase.

13. The transport apparatus according to claim 1, wherein the mover does not receive a thrust due to the second component measuring the impedance of the at least one of the plurality of coils.

14. A transport apparatus comprising:
a plurality of coils arranged in a predetermined direction;
a mover that is movable in the predetermined direction; and
a control device configured to apply a current to each of the plurality of coils to move the mover in the predetermined direction,
wherein the control device is configured to apply, to each of the plurality of coils, the current including a second component measuring an impedance of at least one of the plurality of coils and a first component apply a thrust to the mover and determined based on the second component.

15. A processing system comprising:
the transport apparatus according to claim 14; and
a processing apparatus configured to process a workpiece transported by the mover.

16. A method of manufacturing an article using a processing system having the transport apparatus according to claim 14, and a processing apparatus configured to process a workpiece transported by the mover, the method comprising:
transporting the workpiece by the mover; and
processing, by the processing apparatus, the workpiece transported by the mover.

17. The transport apparatus according to claim 14,
wherein the current is applied to each of the plurality of coils based on a third current command value,
wherein the third current command value is a value in which a first current command value and a second current command value are superimposed,
wherein the second current command value indicates a current equivalent to the second component for measuring the impedance of at least one of the plurality of coils, and
wherein a control unit is configured to determine the first current command value based on a thrust command value indicating a thrust applied to the mover and the second current command value.

18. A method for a transport apparatus having an electric motor including a mover and a plurality of coils, the method comprising:
driving the mover by application of a current to each of the plurality of coils; and
controlling the electric motor, wherein controlling includes measuring an impedance of each of the plurality of coils, and controlling the current flowing through each of the plurality of coils based on a third current command value in which a first current command value indicating a current corresponding to a thrust command value indicating a thrust applied to the mover and a second current command value indicating a current for measuring the impedance of each of the plurality of coils are superimposed, and
wherein controlling includes determining the second current command value such that the mover does not receive a thrust due to a component corresponding to the second current command value in the current flowing through each of the plurality of coils when measuring the impedance of each of the plurality of coils.

19. The method according to claim 18, wherein the second current command value includes a non-zero vector that belongs to a null space of a thrust constant matrix showing a relationship between thrust received by the mover and a vector having the currents, each flowing through each of the plurality of coils as elements.

20. The method according to claim 18, wherein measuring includes measuring the impedance of each of the plurality of coils based on a voltage applied to both ends of each of the plurality of coils and the current flowing through each of the plurality of coils.

21. The method according to claim 20, wherein measuring further includes measuring the impedance of each of the plurality of coils based on a speed of the mover.

22. The method according to claim 18, wherein controlling the current includes determining, based on the first current command value, whether or not the first current command value and the second current command value are to be superimposed.

23. A transport apparatus comprising:
a plurality of coils arranged in a predetermined direction;
a mover that is movable in the predetermined direction; and
a control device configured to apply a current to each of the plurality of coils to move the mover in the predetermined direction,
wherein, when the mover moves in the predetermined direction, the control device applies, to at least one coil of the plurality of coils, a current determined based on information on a thrust to be applied to the mover and measures an impedance of the at least one coil to which the current is applied.

* * * * *